(12) United States Patent
Hagspiel et al.

(10) Patent No.: US 8,995,210 B1
(45) Date of Patent: Mar. 31, 2015

(54) WRITE AND READ COLLISION AVOIDANCE IN SINGLE PORT MEMORY DEVICES

(71) Applicant: International Business Machines Corporation, Armonk, NY (US)

(72) Inventors: Norbert Hagspiel, Wendlingen (DE); Sascha Junghans, Ammerbuch (DE); Matthias Klein, Boeblingen (DE); Joerg Walter, Tuebingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/090,060

(22) Filed: Nov. 26, 2013

(51) Int. Cl.
*G11C 7/00* (2006.01)
*G11C 7/22* (2006.01)
*G11C 7/10* (2006.01)

(52) U.S. Cl.
CPC ............. *G11C 7/222* (2013.01); *G11C 7/1015* (2013.01)
USPC ..................... 365/194; 365/154; 365/189.04

(58) Field of Classification Search
CPC .... G11C 7/222; G11C 7/1015; G11C 7/1039; G11C 7/1042
USPC ............ 365/194, 154, 189.04, 230.05; 711/5, 711/104, 150, 167
See application file for complete search history.

(56) References Cited

U.S. PATENT DOCUMENTS

| | | | |
|---|---|---|---|
| 5,818,751 A | 10/1998 | Ho et al. | |
| 5,831,906 A | 11/1998 | Yih et al. | |
| 6,147,926 A * | 11/2000 | Park | 365/233.1 |
| 6,915,400 B2 | 7/2005 | Engelahardt | |
| 8,209,478 B2 | 6/2012 | Chiu | |
| 2012/0144103 A1 | 6/2012 | Ko et al. | |
| 2013/0290646 A1 * | 10/2013 | Greenwood et al. | 711/149 |

OTHER PUBLICATIONS

Anonymous, "Control for activation of reduced leakage mode in write circuitry of SRAM arrays and register files", an IP.com Prior Art Database Technical Disclosure, IP.com No. IPCOM000216955D, published electronically Apr. 25, 2012. http://ip.com/IPCOM/000216955.

Truong, K., "A Simple Built-In Self Test for Dual Ported SRAMs", MTDT'00 Proceedings of the 2000 IEEE International Workshop on Memory Technology, Design, and Testing., pp. 79-84, © 2000 IEEE, Washington DC. DOI: 10.1109/MTDT.2000.868619.

* cited by examiner

*Primary Examiner* — Tan T. Nguyen
(74) *Attorney, Agent, or Firm* — Jonathan V. Sry

(57) ABSTRACT

A method of avoiding a write collision in single port memory devices from two or more independent write operations is described. A first write operation having a first even data object and a first odd data object is received from a first data sender. A second write operation having a second even data object and a second odd data object is received from a second data sender at substantially the same time as the first write operation. The second write operation is delayed so that the first even data object writes to a first single port memory device at a different time than the second even data object writes to the first single port memory device. The second write operation is delayed so that the first odd data object writes to a second single port memory device at a different time than the second odd data object.

20 Claims, 9 Drawing Sheets

WRITE AND READ COLLISION AVOIDANCE IN SINGLE PORT MEMORY DEVICES

BACKGROUND

This invention relates generally to single port memory device, and more particularly, to write and read collision avoidance system in single port memory device.

Single port memory devices may allow only one write or read operation at a time. Examples, of single port memory devices may include static random access memory (SRAM), dynamic random access memory (DRAMs), or the like. SRAM is a volatile memory where any data stored is erased when the power supply to the SRAM is turned off. An SRAM cell is often made up of six transistors. Four transistors make up a cross-coupled latch that either stores a logical one or a logical zero. The other two transistors are used for accessing the SRAM cell during read and write operations. Access speed for SRAM is fast compared to certain other memories and so therefore is often used as cache memory and for buffers. Single port memory devices such as SRAM are often used as buffers between two asynchronous circuits.

SUMMARY

In various embodiments of the present disclosure, a method of avoiding a write collision in single port memory devices from two or more independent write operations is described. A first write operation having a first even data object and a first odd data object is received by a module from a first data sender. The module receives a second write operation having a second even data object and a second odd data object from a second data sender at substantially the same time as the first write operation. The second write operation is delayed so that the first even data object writes to a first single port memory device at a different time than the second even data object writes to the first single port memory device. The second write operation is delayed so that the first odd data object writes to a second single port memory device at a different time than the second odd data object. The first even data object and first odd data object are written to respective first and second single port memory devices. The second even data object and second odd data object are written to the respective first and second single port memory devices.

In other various embodiments, a semiconductor chip is described. The semiconductor chip includes a module. The module includes a first single port memory device configured to store a first even data object and a second even data object. The module further includes a second single port memory device configured to store a first odd data object and a second odd data object. The module is configured to receive a first write operation having a first even data object and a first odd data object from a first data sender. The module is further configured to receive a second write operation having a second even data object and a second odd data object from a second data sender at substantially the same time as the first write operation. The module may delay the second write operation so that the first even data object writes to a first single port memory device at a different time than the second even data object writes to the first single port memory device. The module may further delay the second write operation so that the first odd data object writes to a second single port memory device at a different time than the second odd data object. The module may write the first even data object and first odd data object to respective first and second single port memory devices and write the second even data object and second odd data object to the respective first and second single port memory devices.

In yet other various embodiments, a method of avoiding read collisions from single port memory devices from two or more independent read operation requests is described. A first read request is received for a first even data object and a first odd data object from a first read requester. A second read request is received for a second even data object and a second odd data object from a second read requester at substantially the same time as receiving the first read request. The first even data object is read from the first single port memory device. The second odd data object is read from the second single port memory device at substantially the same time as reading the first even data object from the first single port memory device. The second even data object is read from the first single port memory device. The first odd data object is read from the second single port memory device at substantially the same time as reading the second even data object from the first single port memory device.

BRIEF DESCRIPTION OF THE DRAWINGS

Embodiments will be better understood from the following detailed description with reference to the drawings, in which.

DETAILED DESCRIPTION

Figure 1:
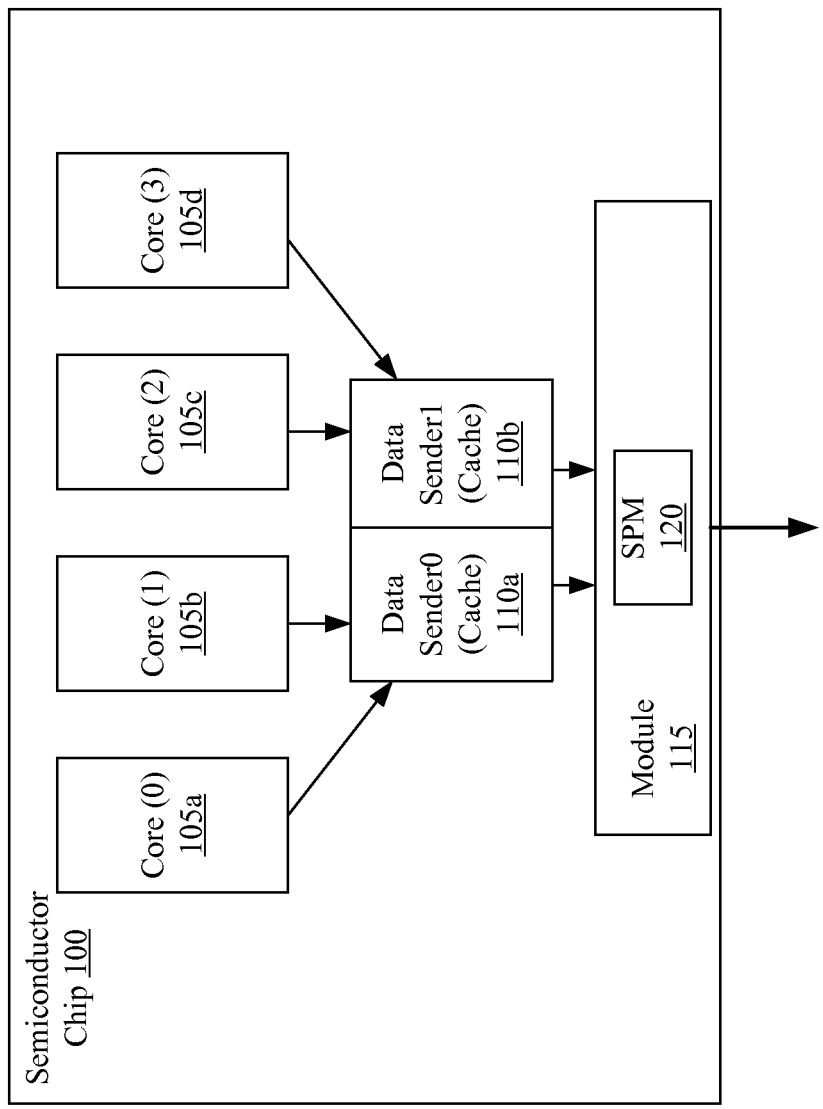
FIG. 1 illustrates a block diagram of a semiconductor chip on which a module supporting single port memory device is configured to avoid write collision and read collisions, according to embodiments.

Features illustrated in the drawings are not necessarily drawn to scale. Descriptions of well-known components and processing techniques are omitted so as to not unnecessarily obscure the disclosed embodiments. The descriptions of embodiments are provided by way of example only, and are not intended to limit the scope of this invention as claimed. The same numbers may be used in the Figures and the Detailed Description to refer to the same devices, parts, components, steps, operations, and the like.

Embodiments herein provide for a semiconductor chip and method of avoiding single port memory device write collisions from two or more data object senders performing write operations that may occur at the same time resulting in the write collision. Avoiding write collisions may be done by dividing a data object of a write operation into two or more sub-data objects. The division may occur for each write operation and each sub-data object of a write operation may have a dedicated single port memory device. Each dedicated single port memory device may store a type of sub-data object from each write operation. This allows write operations arriving to the single port memory devices at the same time to write a first type sub-data object from a first write operation to a first single port memory device at the same time as a second type sub-data object from a second write operation writes to a second single port memory device. In embodiments, the data objects may be aligned and delayed as necessary of the purpose of preventing write collisions on the same single port memory device by dedicating a first single port memory device to even data objects and a second single port memory device to odd data objects.

Other embodiments include storing even data objects to a first single port memory and odd data objects to a second single port memory at substantially the same time. The even and odd data object from two or more senders may be interleaved when storing to the single port memories so as not to create a write collision. Yet other embodiments herein provide for a semiconductor chip and a method of avoiding single port memory read collisions to two or more read requesters from the single port memories.

In certain read/write environments for single port memory devices, write collisions may occur. Write collisions may occur when two or more write operations arrive at substantially the same time in the single port memory device. Write collisions may produce errors in an operation trying to be performed. The single port memory devices may receive two or more write operations because they may be receiving write operations from two or more independent sources that share the resources of the single port memory device. Sharing single port memory devices may be advantageous for multiple reasons such as for reduced power and size restrictions.

Not only may there be write collisions in single port memory devices but read collisions may also occur. Read collisions may occur when there are multiple read requesters requesting data objects from a shared single port memory at substantially the same time. Read collisions may also produce errors in an operation trying to be performed.

Aspects of the present disclosure are based upon the recognition that write collisions in single port memory device can be accounted for by using a multiport memory that allows writes to more than one row of the memory at the same time. Each write operation source may have a dedicated write port, which would allow the writing to different rows of the memory at the same time. However, multiport memories can be more expensive than the single port memory devices in the terms of power, area, testability, yield, and development effort. Another recognition for avoiding write collisions in single port memory device is to use twice as many single port memory devices when there are multiple write operations from independent sources. Each source would get its own dedicated single port memory device set. Additional control logic may be used to keep track of which write source owns the actual single port memory device. Doubling the amount of single port memory devices also doubles the cost in terms of power, area, and yield. These recognitions also contemplate avoidance of read collisions due to their nature of avoiding write collisions (multiport and doubled amount of single port memory).

An example of the situation where write collisions may occur in single port memory devices is on a computer processor chip or other semiconductor chip. A data sender (also referred to as a write source herein) on the processor chip, such as level three (L3) cache, may be split into two, which allows for a first and second write operation from two independent write sources, e.g. the first L3 cache and a second L3 cache. The split L3 cache may be connected to a module containing single port memory devices such as a PCI bridge controller. The PCI bridge controller may include a dedicated buffer for each I/O fetch finite state machine (FSM) that fetches a data object from the L3 cache. Each buffer may have a capacity of 256 bytes. The buffers are not all written to at once but at 16 bytes at a 4:1 cycle. There may be a total of 32 buffers in the example module. For efficient power and area reasons, multiple buffers may share a single port memory device such as SRAM or DRAM. Four buffers may be in each SRAM for a total of eight SRAMs used. Buffers within a SRAM may be associated with fetches to either of the L3 caches created by the split. The two L3 caches are independent and responses with data objects may arrive at any time. When two fetch responses (also referred to as write operations) for two buffers sharing the same single port SRAM arrive from the first L3 cache and the second L3 cache at the same time, a write collision may occur.

FIG. 1 illustrates a block diagram of a semiconductor chip 100 on which a module 115 supporting a single port memory device 120 is configured to avoid write collisions, according to embodiments of the present disclosure. The semiconductor chip 100 may be a computer processing chip, for example. The semiconductor chip 100 may include one or more processor cores, collectively referenced as 105. FIG. 1 illustrates four cores 105a, 105b, 105c, and 105d. The semiconductor chip 100 may include a first data sender 110a and a second data sender 110b, collectively referenced as data senders 110 herein. The data senders 110 may be a cache such as an L3 cache, in an embodiment. Each data sender 110 may be shared by the cores 105. The data senders 110 that communicate with a module 115 may send write operations to the module 115. The module 115 may include one or more single port memory devices (SPM) 120. The module 115 may be a peripheral component interconnect (PCI) bridge controller, however, other modules that include single port memory devices 120 may be considered. The module 115 may output to one or more read requesters. In embodiments, multiple semiconductor chips may be used to contain the referenced components.

Embodiments herein may provide for the module 115 to be configured to allow write operations from the data senders 110 to the single port memory device 120 without write collisions. Avoiding write collisions may be done by dividing a data object of a write operation from a data sender 110 into two or more sub-data objects. The division may occur for each write operation and each sub-data object of a write operation may have a dedicated single port memory device 120. Each dedicated single port memory device 120 stores a type of sub-data object from each write operation. This allows write operations arriving to the single port memory devices 120 at the same time to write a first type sub-data object from a first write operation to a first single port memory device at the same time as a second type sub-data object from a second write operation writes to a second single port memory device. In embodiments, the data objects may be aligned and delayed as necessary of the purpose of preventing write collisions on the same single port memory device by dedicating a first single port memory device to even data objects and a second single port memory device to odd data objects. When there is a data request from a single data requester, the module 115 may output the even and odd sub-data objects of the data object in parallel to combine into a whole data object. In other embodiments, when there are two or more data object requests at the same time from two or more read requesters, the module 115 may be configured to send both data objects without resulting in a read collision.

Figure 2:
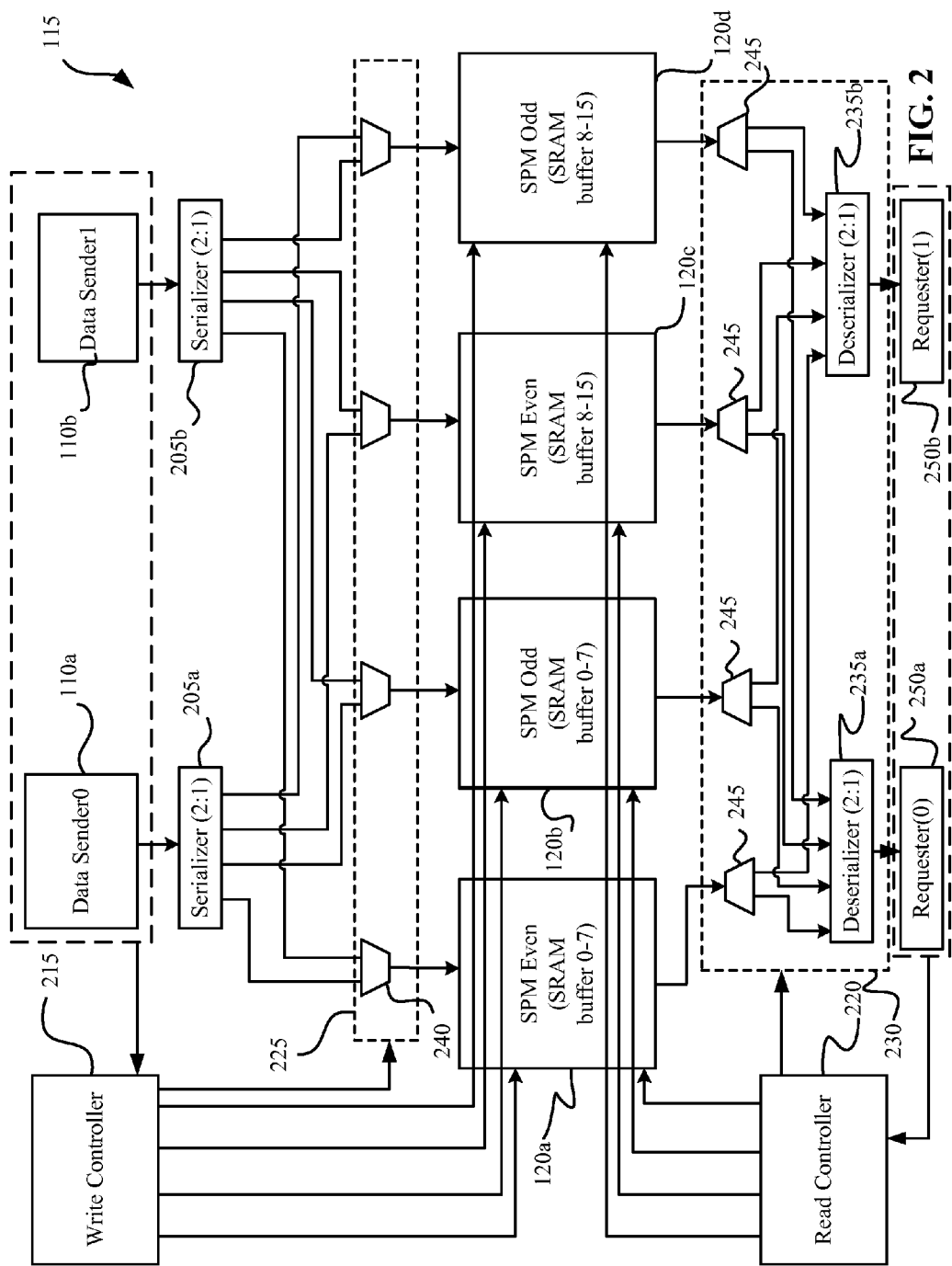
FIG. 2 illustrates a block diagram of a module on which the single port memory device is located and the module configured to avoid write and read collisions on the single port memory device, according to embodiments.

FIG. 2 illustrates a block diagram of a module 115 in which the single port memory device 120 is located and where the module 115 is configured to avoid write collisions and read collisions on the single port memory device 120, according to embodiments. Consistent with certain embodiments, the module 115 may include a serializer for each write operation such as serializers 205a and 205b, collectively referred to as serializer 205. The module 115 may include a plurality of single port memory devices 120 (120a, 120b, 120c, and 120d), a write controller 215, a read controller 220, a write circuitry 225 and a read circuitry 230. A first write operation may come from a first data sender 110a such as a cache or any other circuit that may produce a write operation. A second write operation may come from a second data sender 110b such as a cache or any other circuit that may produce a write operation. The first write operation may produce a first data object. The second write operation may produce a second data object. A data object may be the natural width of an interface bus between the data sender 110 and the single port memory devices 120. In the case of a write operation from L3 cache to a PCI bridge controller, the data object may be 16 bytes, for example.

Once received by the module 115 from the data sender 110, the first data object may enter a first serializer 205a. The second data object may enter a second serializer 205b. The serializers 205 may divide the data objects into multiple sub-data objects. In the illustrated example, the serializers 205 may be 2:1 serializers, which may require that the single port memory device operate at twice the speed of regular bus speed. The serializers 205 may divide the data objects in half into even and odd sub-data objects. This may produce a first even sub-data object and first odd sub-data object from the first data object. A second even sub-data object and a second odd sub-data object may be created by the second serializer 205b from the second data object. In the given example, the 16 byte data objects may be divided into 8 byte sub-data objects. The even sub-data object may be sent to a first single port memory device dedicated for even sub-data objects and the odd sub-data objects may be sent to a second single port memory device dedicated for odd sub-data objects.

The sub-data objects may be written to a plurality of single port memory devices 120. In an embodiment, the single port memory devices 120 may be SRAM. Each single port memory device 120 may be designated for either an even sub-data object or an odd sub-data object. Each single port memory device 120 may contain a plurality of buffers. Single port memory devices 120a and 120b may include eight buffers. Half of each buffer may be in each single port memory device 120a and 120b. For instance, single port memory device 120a may include the even buffer (0) for the even sub-data object and single port memory device 120b may include odd buffer (0) for the odd portion of the data object. Write circuitry 225 may regulate the sub-data objects entering the single port memory devices 120 as shown with exemplary write multiplexors 240. A write controller 215 may be interconnected with the single port memory devices 120 in order to provide a write enable signal and a write address to the single port memory devices. The write controller may be in operable communication with the data senders 110. The data senders 110 may single the write controller 215 when to perform a write. The write controller 215 may also be in communication to each write multiplexor 240 (the write controller 215 is in communication with write circuitry 225 in FIG. 2 for clarity of the figure) to steer the sub-data objects.

For each write enable cycle to the single port memory devices 120, a write operation may be set up to only write either an odd sub-data object or an even sub-data object. This may be done so that the first write operation is not equally aligned with the second write operation. In the illustrated example, the first data sender 110a may write an even sub-data object while the second data sender 110b writes an odd-data object. This arrangement may ensure that no single port memory device write collisions occur. This is because while an even sub-data object is being written to first single port memory device 120a from the first data sender 110a, an odd sub-data object is being written to a second single port memory device 120b from the second sender 110b and vice versa when an odd sub-data object is being written from the first data sender 110b.

Figure 5:
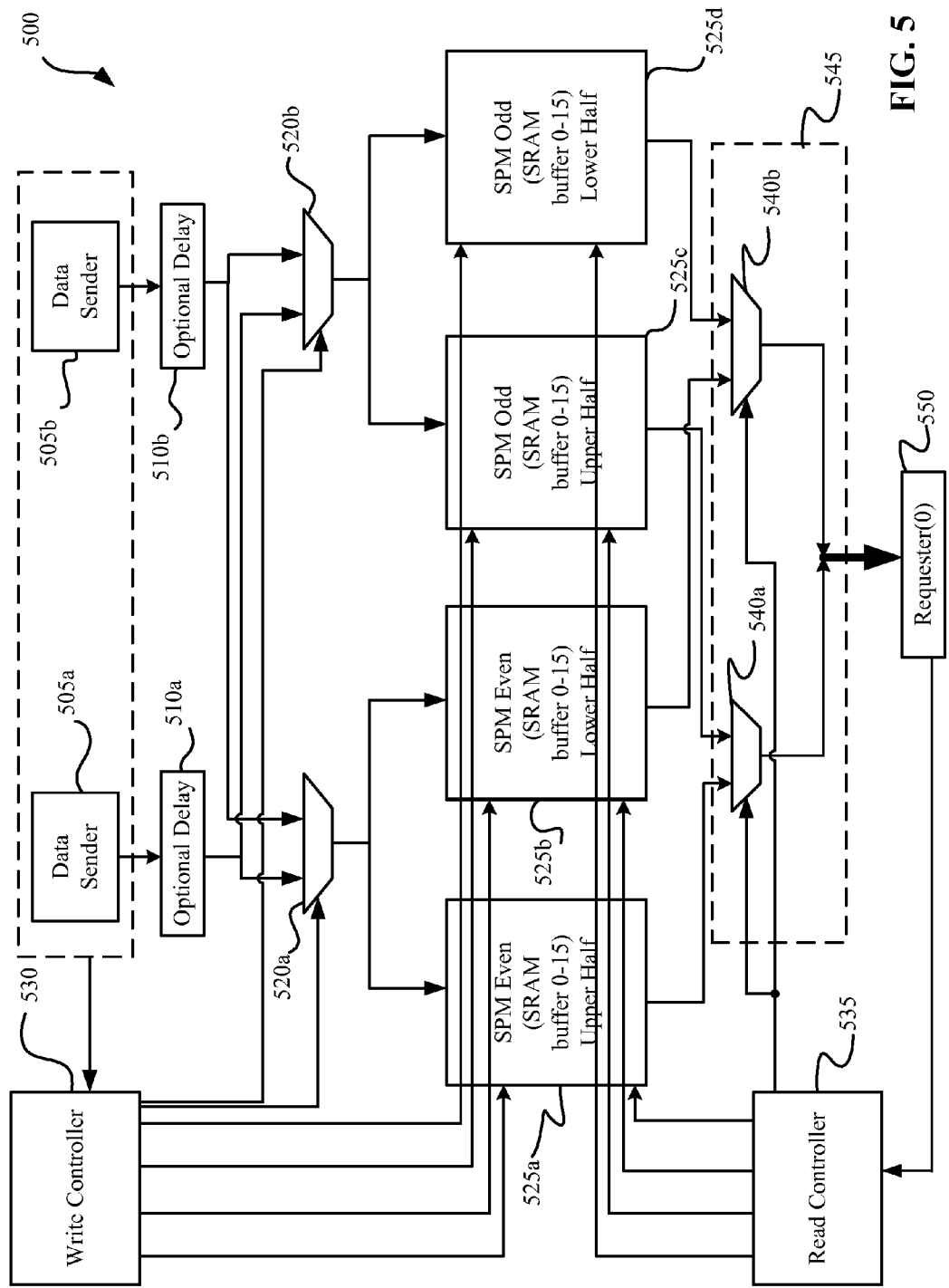
FIG. 5 illustrates a block diagram of a module on which the single port memory device is configured to avoid write collisions of data objects where the data objects are not divided into sub-data objects, according to embodiments.

When the data objects are to be retrieved from the single port memory devices 120, a read controller 220 may manage the read operations that obtain the sub-data objects. The read controller 220 may be interconnected with each of the single port memory devices 120. The read controller 220 may be used to provide a read enable signal and a read address to the single port memory devices 120. The read controller 220 may receive read requests from one or more read requesters 250a and 250b. The read controller 220 may also be in communication with the read circuitry 230. The read controller 220 may control the demultiplexors 245 and the deserializers 235a and 235b of the read circuitry 230 for proper reads. There may be a plurality of read requesters that may request one or more data objects at the same time, which may result in a read collision. FIG. 2 illustrates embodiments of read circuitry 230 when there are two read requesters. In various embodiments, one read may occur at a time from one read requester. FIG. 5 illustrates read circuitry 545, explained further below, which may be used for the module 115 in place of the read circuitry 230 when there is one read requester. When there is one read requester, the odd and even sub-data objects may be retrieved or sent from the single port memory devices 120 for either the first or second data objects. The odd and even sub-data objects may be retrieved in parallel to form the complete first or second data object depending on which data object is requested.

In other embodiments, there may be two read requesters as illustrated in FIG. 2. There may be a first read request for a data object from a first read requester 250a at the same time as a second request from a second read requester 250b for a data object stored in at least one same single port memory. This may cause a read collision similar to the write collisions explained above. The single port memories 120 may be communication to a respective demultiplexor 245. Each demultiplexor 245 may be in communication with a first deserializer 235a and a second deserializer 235b. The read controller 220 may manage the outputs of the demultiplexors 245 and the deserializers 235a and 235b. The first read requester 250a may be coupled to an output of the first deserializer 235a and the second read requester 250b may be coupled to an output of the second deserializer 235b. Both read requesters may be coupled to the read controller 220 for signaling reads.

In various embodiments, the first and second data objects may be stored in at least one of the same single port memories, which may be single port memory 120a for even sub-data objects and single port memory 120b for odd sub-data objects. The first read requester may request the first data object at the same time as the second requester requests the second data object. If two read requests occur, then read controller 220 of module 115 may direct the first even-sub data object of the first data object from the even single port memory 120a to be sent to the first deserializer 235a. Also, the second odd sub-data object of the second data object from the odd single port memory 120b may be sent to the second deserializer 235b. This may all occur at a first half cycle of the read. During the second half cycle of the read, the read controller 220 of module 115 may direct the second even-sub data object of the second data object from the even single port memory 120a to be sent to the second deserializer 235b. Also, the first odd-sub data object of the first data object from the even single port memory 120a may be sent to the first deserializer 235a. At the first deserializer 235a, the first odd sub-data object and the first even sub-data object may be combined to output the first data object to the first read requester. At the second deserializer 235b, the second even sub-data object may be combined with the second odd sub-data object to output the second data object to the second read requester.

Figure 3:
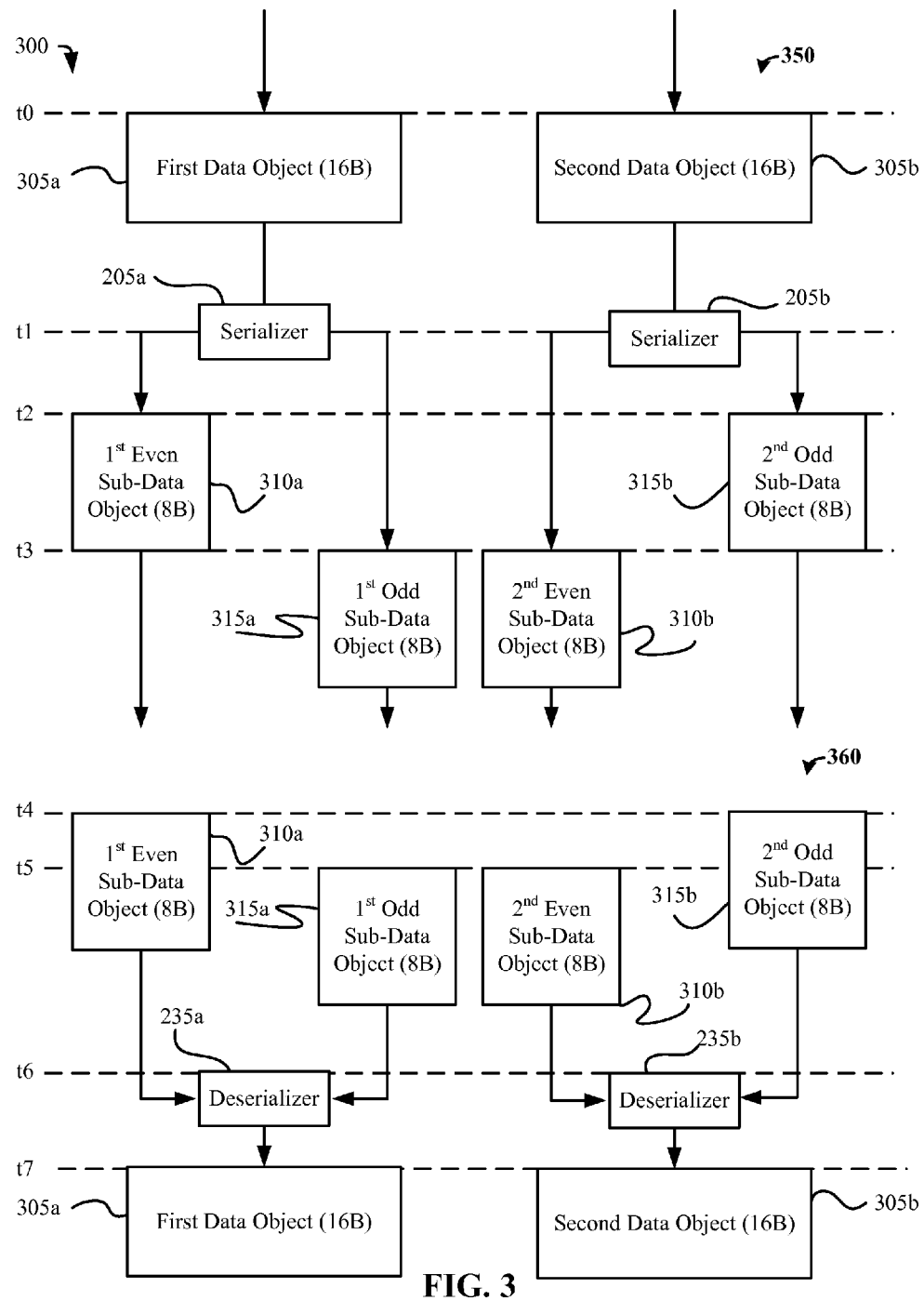
FIG. 3 illustrates a timing chart of the flow of data objects through the module of FIG. 2, according to embodiments.

FIG. 3 illustrates a timing chart 300 of the flow of the data objects through the module 115, according to an embodiment. Reference number 350 points to the write operation portion of the write/read of the data objects. Reference number 360 points to the read operation portion of the write/read of the data objects. For the write operation 350, at time t0, a first write operation may send a first data object 305a to the module 115 and a second write operation may send second data object 305b at the substantially the same time. The first write operation may come from a first sender 110a (FIG. 1). The second write operation may come from a second sender 110b (FIG. 1).

At time t1, the first data object 305a and the second data object 305b may both enter their respective first serializer 205a and second serializer 205b. The first serializer 205a may divide the first data object 305a into a first even sub-data object 310a and a first odd sub-data object 315a. For example, a 16 B data object may be divided into two 8 B sub-data objects. In other embodiments, the first serializer 205a may divide the first data object 305a into any number of sub-data objects. Also, the second serializer 205b may divide the second data object 305b into a second even sub-data object 310b and a second odd sub-data object 315b. In other embodiments, the second serializer 205b may divide the second data object 305b into any number of sub-data objects.

At time t2, the first even sub-data object 310a may be written to a single port memory device that supports even sub-data objects. The second odd-sub data object 315b may be written to a single port memory device that supports odd sub-data objects. In other embodiments, the timing of the second odd sub-data object 315b may occur later. The second serializer 205b may be delayed a half cycle from the first serializer 205a and begin with the second even sub-data object 310b being written at time t3 and then the second odd sub-data object 315b being written subsequently.

At time t3, the first odd sub-data object 315a may be written to a single port memory device that supports odd sub-data objects. The second even sub-data object 310b may be written to a single port memory device that supports even sub-data objects. Alternating the sub-data objects as they are being written to the single port memory devices may avoid write collisions for data objects that arrive at the module at substantially the same time from independent senders.

Figure 7:
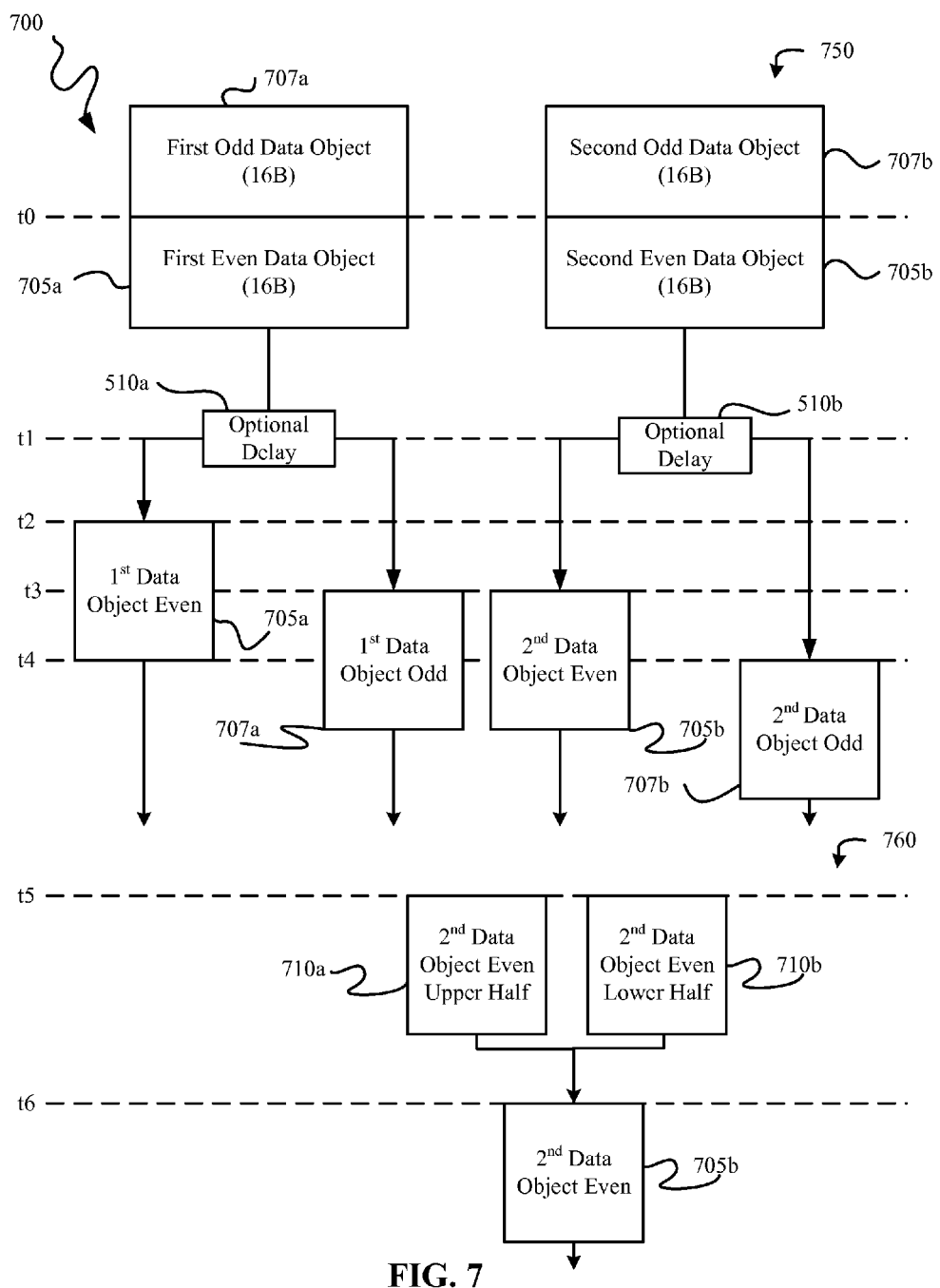
FIG. 7 illustrates a timing chart of the flow of the data objects through a module, such as a module of FIG. 5, according to embodiments.

Reference number 360 points to the read operation of the sub-data objects from the single port memory devices. The read operation may include two independent read requests from two read requesters. At time t4, the read controller 220 (FIG. 2) may receive a first read request from a first read requester for the first data object 305a. The read controller 220 may also receive a second read request from a second read requester for the second data object 305b. The read controller 220 may issue a first read command for the first data object 305a and a second read command for the second data object 305b. The odd and even single port memory devices may output the first even sub-data object 310a of the first data object 305a and the second odd sub-data object 315b of the second data object 305b during the a first half cycle of the read command. In other embodiments, there may only be one read requester, the timing of which is illustrated in FIG. 7.

At time t5, during the second half cycle of the read command, the read controller 220 may issue a command for the first odd sub-data object 315a to be sent for the first data object 305a from the odd single port memory 120b. The second even sub-data object 310b for the second data object 305b may be sent from the even single port memory 120a.

At time t6, the first even sub-data object 310a and the first odd sub-data object 315a may enter the first deserializer 235a (FIG. 2) for the first read requester. The second even sub-data object 310b and the second odd sub-data object 315b may enter the second deserializer 235b for the second read requester also at time t6.

At time t7, the first deserializer 235a may output the first even and odd sub-data objects 310a and 315b concatenated as the first data object 305a to the first read requester. Also at time t7, the second deserializer 235b the second even and odd sub-data objects 310a and 315b concatenated as the second data object 305a to the second read requester. Interleaving more than one data objects by breaking them apart and sending sub parts of each data object together and combining the appropriate parts again may avoid read collisions from a single port memory when there are two or more read requesters.

Figure 4:
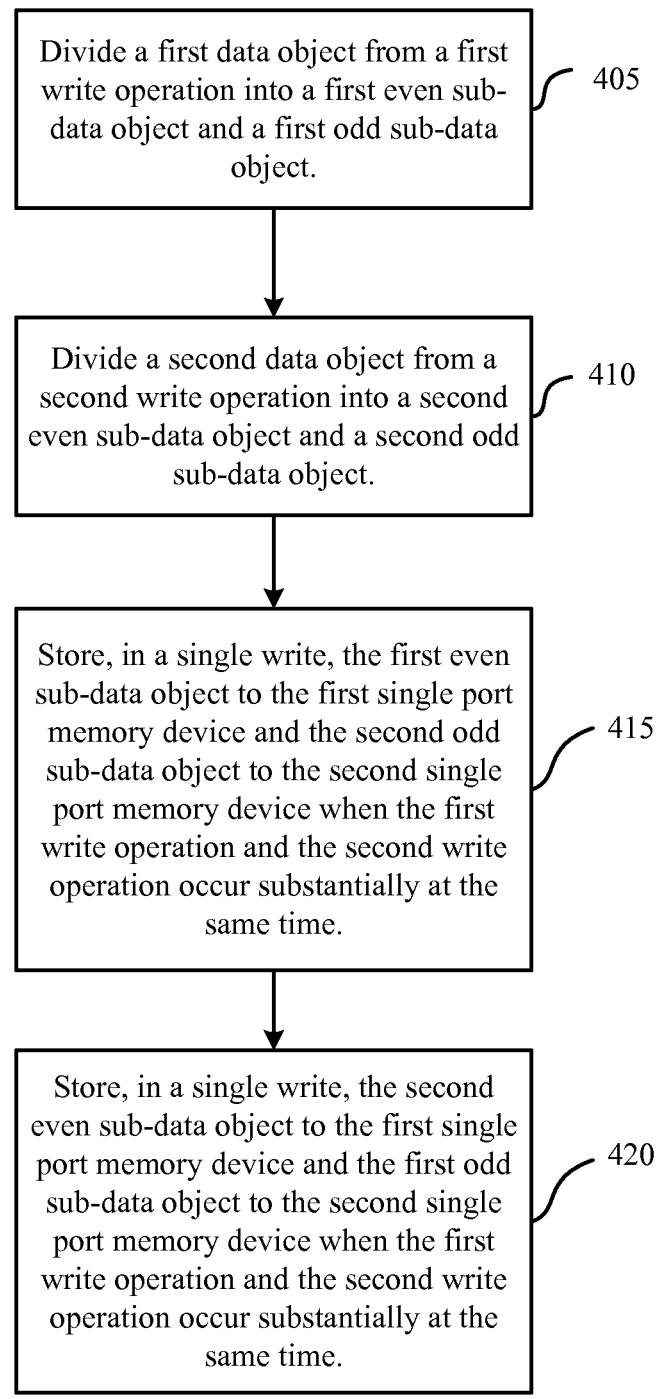
FIG. 4 illustrates a flowchart for avoiding write collision in a single port memory device, according to embodiments.

FIG. 4 illustrates a flowchart of a method 400 for avoiding write collisions in a single port memory device, according to embodiments of the disclosure. The method 400 may begin at operation 405. In operation 405, a first data object may be divided into a first even sub-data object and first odd sub-data object. In an embodiment, the first data object may result from a first write operation. The first write operation may be sent from a first data sender such as cache (L3 cache) or any other circuit source to a single port memory device such as SRAM or DRAM. In an embodiment, the first data object may be evenly split into the first even sub-data object and the first odd sub-data object. In other embodiments, how the first data object is divided, whether it be evenly or unevenly and how many times it is divided, e.g., thirds or fourths, may be contemplated. The division of the first data object may be done by a first serializer.

In operation 410, a second data object may be divided into a second even sub-data object and second odd sub-data object. In an embodiment, the second data object may result from a second write operation. The second write operation may occur from a second data sender such as cache (L3 cache) or any other circuit data object source to a single port memory device such as an SRAM or DRAM. In an embodiment, the second data object may be evenly split into the second even sub-data object and the second odd sub-data object. In other embodiments, how the second data object is divided, whether it be evenly or unevenly and how many times it is divided, e.g., thirds or fourths, may be contemplated. The division of the second data object may be done by a second serializer.

In operation 415, the first even sub-data object may be stored in the first single port memory device and the second odd sub-data object may be stored in the second single port memory device. In operation 420, the second even sub-data object may be stored in the first single port memory device and the first odd sub-data object may be stored in the second single port memory device. When writing the first and second odd sub-data object to a second single port memory device, the first and second data objects may be aligned so that writes of the first and second odd sub-data objects do not occur at the same time. In various embodiments, the first and second write operations may be aligned so that when the first even sub-data object is being written to the first single port memory device, the second odd sub-data object is being written to the second single port memory device. Likewise, when the first odd sub-data object is being written to the second single port memory device, then the second even sub-data object is being written to the first single port memory device.

FIG. 5 illustrates a block diagram of a module 500 on which the single port memory device is configured to avoid write collisions of data objects where the data objects are not divided into sub-data objects, according to embodiments Consistent with certain embodiments, the module 500 can be used as the module 115 of FIG. 1. The module 500 can be configured to operate without a serializer and without using sub-data objects. Regular bus width of the data objects may be used in module 500. Each of the data objects may be odd or even depending on the lowest order address bit. Also, the data bus may run at its regular data width and speed in module 500.

Figure 6:
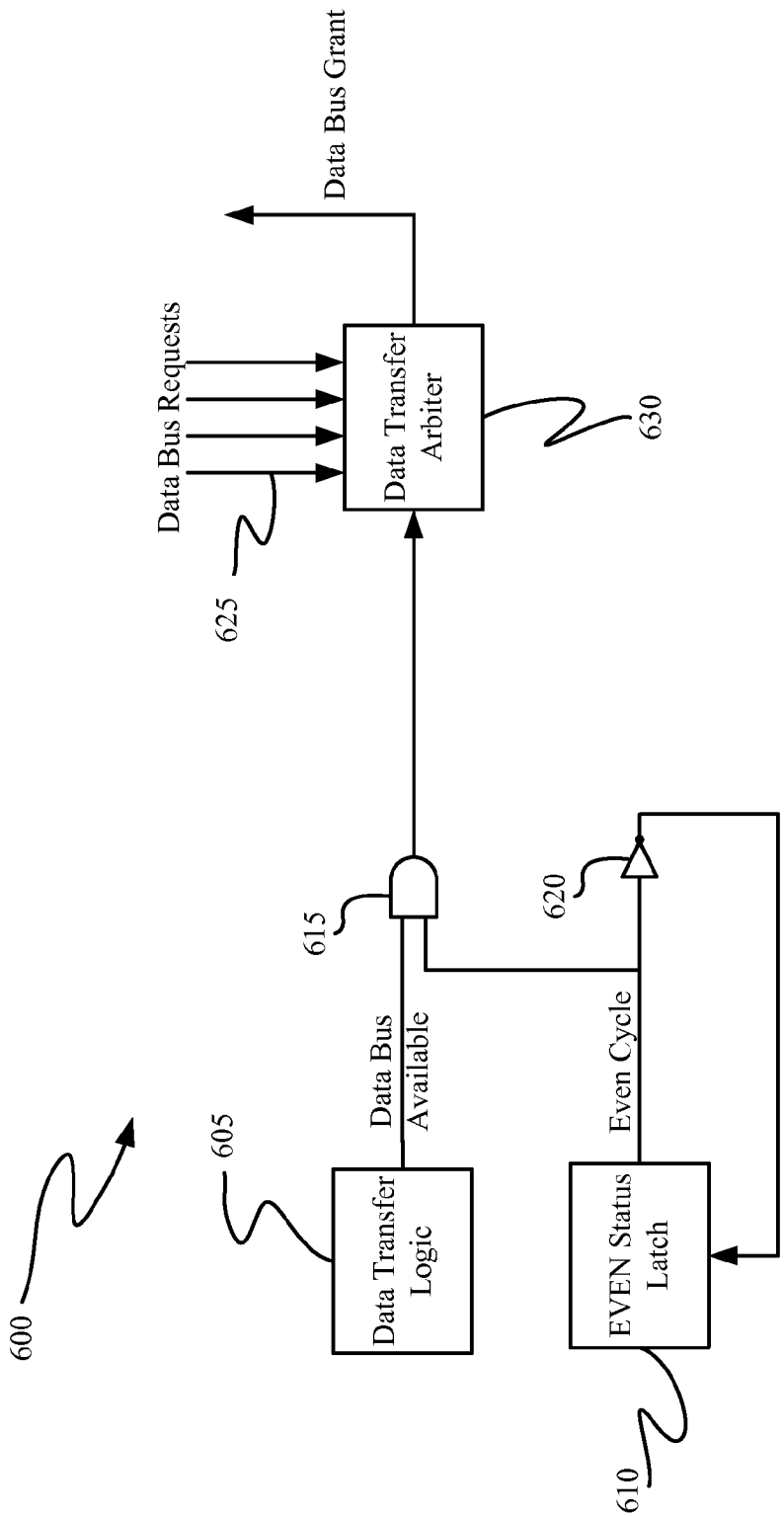
FIG. 6 illustrates launch logic of a data sender sending a write operation, according to embodiments.

The various embodiments discussed herein, including those discussed in connection with FIGS. 2 and 5 may have different requirements on the specific type and amount of logic that is used. For instance, a first data sender 505a, a second data sender 505b, and the module 500 are illustrated in FIG. 5. The first data sender 505a and the second data sender 505b may include launch logic to allow for the logic of the module 500 to operate correctly. An example of the launch logic is shown in FIG. 6 and explained further below. The module 500 may include a first optional delay 510a and a second optional delay 510b that may be referred collectively as optional delay 510 herein. The module 500 may include a first write multiplexor 520a and a second write multiplexor 520b that may be referred collectively as write multiplexor 520. The module 500 may also include a plurality of single write port memories. Four single port memory devices are shown in FIG. 5 as an example, single port memory device 525a, 525b, 525c, and 525d. The single port memory devices may be referred to collectively as single port memory device 525 herein. The module 500 may also include a write controller 530 and a read controller 535. The module 500 may also include a first read multiplexor 540a and a second read multiplexor 540b, which may be referred to collectively as read multiplexor 540 herein.

The first data sender 505a and the second data sender 505b may be communicatively coupled with respective first optional delay 510a and second optional delay 510b of the module 500. The data senders 505 may include a modified launch logic that is further explained in FIG. 6. The launch logic may be used to ensure that the data transfers from the senders 505 arrive at the module 500 aligned in the same way. Each data transfer may contain a plurality of data objects. The data objects may alternate as even and odd data objects in the order they are to be sent to the single port memories. The data senders 505 may wait to transfer the data objects after both senders have the same number of data objects. Once the data transfers are received by the module 500 and aligned the same way, then they may be guaranteed by the optional delays to have the data objects arrive at the actual single port memory devices 525 differently aligned and at substantially the same time. For example, the optional delays 510 may ensure that one data sender 505 will send its even data objects to the single port memory devices 525 when the other data sender sends its odd data objects. The delay is optional because zero is a valid even number of delay. For instance, when both senders have the same amount of data objects to write, one sender may start immediately without a delay, while the other sender may be delayed by one data object.

The first and second optional delays 510a and 510b are communicatively coupled with an even multiplexor 520a and an odd multiplexor 520b, respectively. The even multiplexor 520a may receive the even data objects and the odd multiplexor 520b may receive the odd data objects from either data sender 505. The even multiplexor 520a may be communicatively coupled to a first even single port memory device 525a, and a second even single port memory device 525b. The first even single port memory device 525a (highest order bit addresses) may receive an upper half of the even data object and the second even single port memory device 525b may receive a lower half (lowest order bit addresses) of the even data object. Likewise, the first odd single port memory device 525c may receive an upper half of the odd data object and the second odd single port memory device 525d may receive a lower half of the odd data object. In other embodiments, a double wide single port memory device may be used so that each single port memory device has the same width as the even or odd data object.

The data senders 505 may also in operable communication with the write controller 530. The write controller may receive write commands from the data senders 505. A write controller 530 may be communicatively coupled with each single port memory device 525 and may signal a write address and a write enable for the write address. The write controller 530 may be in sync for the upper half and lower half of the data object writes. The even pair of single port memory devices may be treated by the write controller 530 as one single port memory device. The odd pair of single port memory devices 525 may be treated by the write controller 530 as one single port memory device also.

FIG. 5 illustrates an embodiment of the read operation from the single port memories when there is a single read requester. The read controller 535 may be communicatively coupled with each single port memory device 525 and may signal a read address and read enable for the data objects within the single port memory device 525 when a read request is received from a read requester 550. The read requester 550 may be communicatively coupled to the read controller. The read controller 535 may signal for the upper half and lower half of the requested data object at substantially the same time. The even pair of single port memory devices may be treated by the read controller 535 as one single port memory device. Likewise, the odd pair of single port memory devices 525 may be treated by the read controller 535 as one single port memory device. The data objects may be signaled to a read circuitry 545 that may contain an upper read multiplexor 540a for upper half data objects and a lower read multiplexor 540b for lower half data objects. The upper half and lower half of the even data objects may be signaled together when requested. The two halves may be concatenated by being sent in parallel. Likewise, the upper and lower halves of the odd data objects may be signaled together when an odd data object is requested. The two halves may concatenated by being sent in parallel. In various embodiments the read circuitry 545 may be replaced with the read circuitry 230 of FIG. 2 when there are two or more read requesters.

Figure 9:
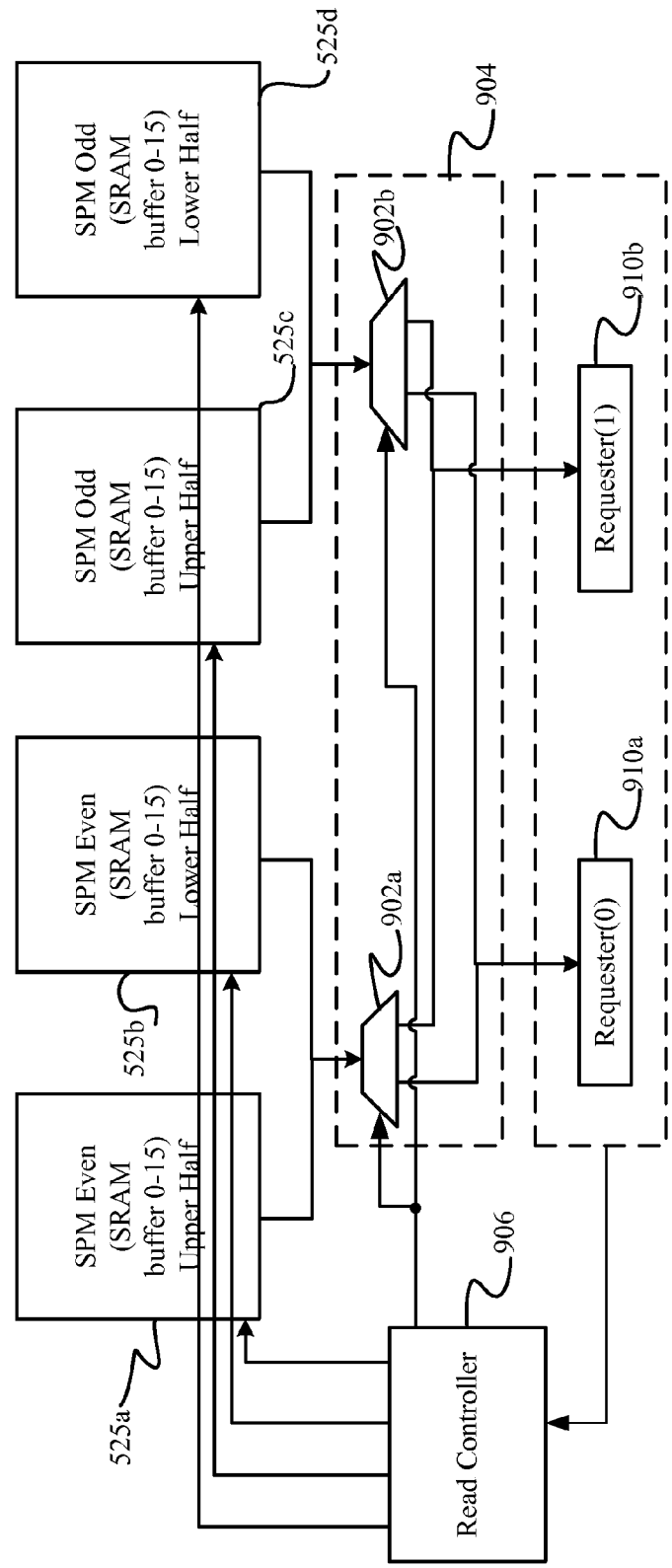
FIG. 9 illustrates read operation circuitry for the module of FIG. 5, according to various embodiments.

Referring now to FIG. 9, FIG. 9 illustrates module 500 where there are two read requesters from the system. Specifically FIG. 9 illustrates the part of the module 500 that includes the read operations. The even single port memories 525a and 525b may be communicatively coupled to a first demultiplexor 902a. The odd single port memories 525c and 525d may be coupled a second demultiplexor. When each pair of single port memories are read, the outputs of the upper half and lower half of the single port memories may be concatenated before reaching their respective demultiplexors 902a and 902b. The demultiplexors 902 may route the data objects to either the first data sender 910a or second data sender 910b depending on where the data object is destined to go. The read controller may control when the reads occur from the single port memories 525 and also the demultiplexors 902 of the read circuitry 904.

The first read requester 910a and the second read requestor 910b may request a read from the single port memories 525a at substantially the same time. The first and second requesters 910a and 910b may have delay logic that ensures that there is not a read collision from two or more read requesters by alternating the odd and even data objects between the first and second read requesters. The delay logic may delay a request for a data object by one cycle for one of the requesters. One requestor may receive even data objects while the other receives odd data objects. In various embodiments, the read controller 906 may contain the receive logic so that when both requestors 910a and 910b request a data object at substantially the same time, the read controller 906 may direct the even data object be read for the first read requester 910a while the odd data object is being read by the second data requester 910b.

FIG. 6 illustrates exemplary launch logic 600 of a data sender 505, according to an embodiment. The launch logic 600 includes a data transfer logic 605, an EVEN status latch 610, an AND gate 615, an inverter 620, and a data transfer arbiter 630 that receives data bus requests 625. The data transfer logic 605 may be the logic that counts data objects and signals the data transfer arbiter 630 when the data bus is available. The data transfer logic 605 may signal the AND gate 615 with a logical one when the data bus is available to the module 500. The even status latch 610 may signal to the AND gate 615 a logical one when the data object sender 505 is at an even cycle such as 4:1 cycle. When the data bus is available and the sender 505 is at an even cycle then the data bus requests 626 may be granted by the data transfer arbiter 630 and sent to the module 500.

In certain embodiments, if there is an odd number of data objects, then at the optional delays 510 a data transfer with an odd number of data objects may be delayed to wait for one data object to start from an even data transfer to start on an even grid. In various embodiments, it may be possible to replace the even status latch 610 with an odd status latch in one of the data senders 505. This may allow the data objects being sent from the data senders 505 to be alternating between odd and even data objects without requiring the optional delay circuitry 510.

FIG. 7 illustrates a timing chart 700 of the flow of the data objects through the module 500, according to embodiments. Reference number 750 illustrates a write operation to the single port memories 525 of module 500 and reference number 760 illustrates a read operation from the single port memories 525 of module 500. The read operation illustrates a read request from a single read requester. At time t0, a first write operation with at least a first even data object 705a and a first odd data object 707a may be sent from a first data sender 505a. A second write operation with at least a second even data object 705b and a first odd data object 707a may be sent from a second data sender 505b at substantially the same time as the first write operation is sent from the first sender 505a. The write operations may be sent to an optional delay 510.

At time t1, the optional delay 510 may delay one of the write operations so that an even data object from one write operation is not being written to a single port memory device at the same time as another even data object from another write operation. Likewise, the optional delay 510 may delay a write operation so that two odd data objects are not being written to a single port memory device at substantially the same time. In the example shown in timing chart 700, the second write operation may be delayed.

At time t2, the first even data object 705a from the first write operation may be written to a single port memory device dedicated for even data objects. The second even data object 705b may be delayed so that it is not written to the single port memory device at the same time as the first even data object 705a.

At time t3, the second even data object 705b may be written to the single port memory device dedicated for even data objects. Also at time t3, the first odd data object 707a may be written to a single port memory device dedicated for odd data objects.

At time t4, the second odd data object 707b may be written to a single port memory device dedicated for odd data objects. The delays may ensure that the data object writes to the same single port memory device occur at different times, which may avoid write collisions in the single port memory devices. In embodiments, each odd and even data object may split into separate single port memories dedicated for the lower and upper half of the data objects.

Referring now to the single read request from a single read requester to the single port memory devices referenced by reference number 760. At time t5, the read requester may make a request for the second even data object. The second even data object may have been divided into an upper half 710a stored in the first even single port memory 525a (FIG. 5) and a lower half 710b stored in the second even single port memory 525b. The read controller 535 may signal the single port memories containing the upper half 710a and the lower half 710b of the second even data object 705b when there is a request. The single port memories may send the upper half 710a at substantially the same time as the lower half 710b.

At time t6, the upper half 710a and the lower half 710b may concatenated when sent in parallel. The concatenated halves may form the complete second even data object 705b. The second even data object 705b may continue on to the read requester.

Figure 8:
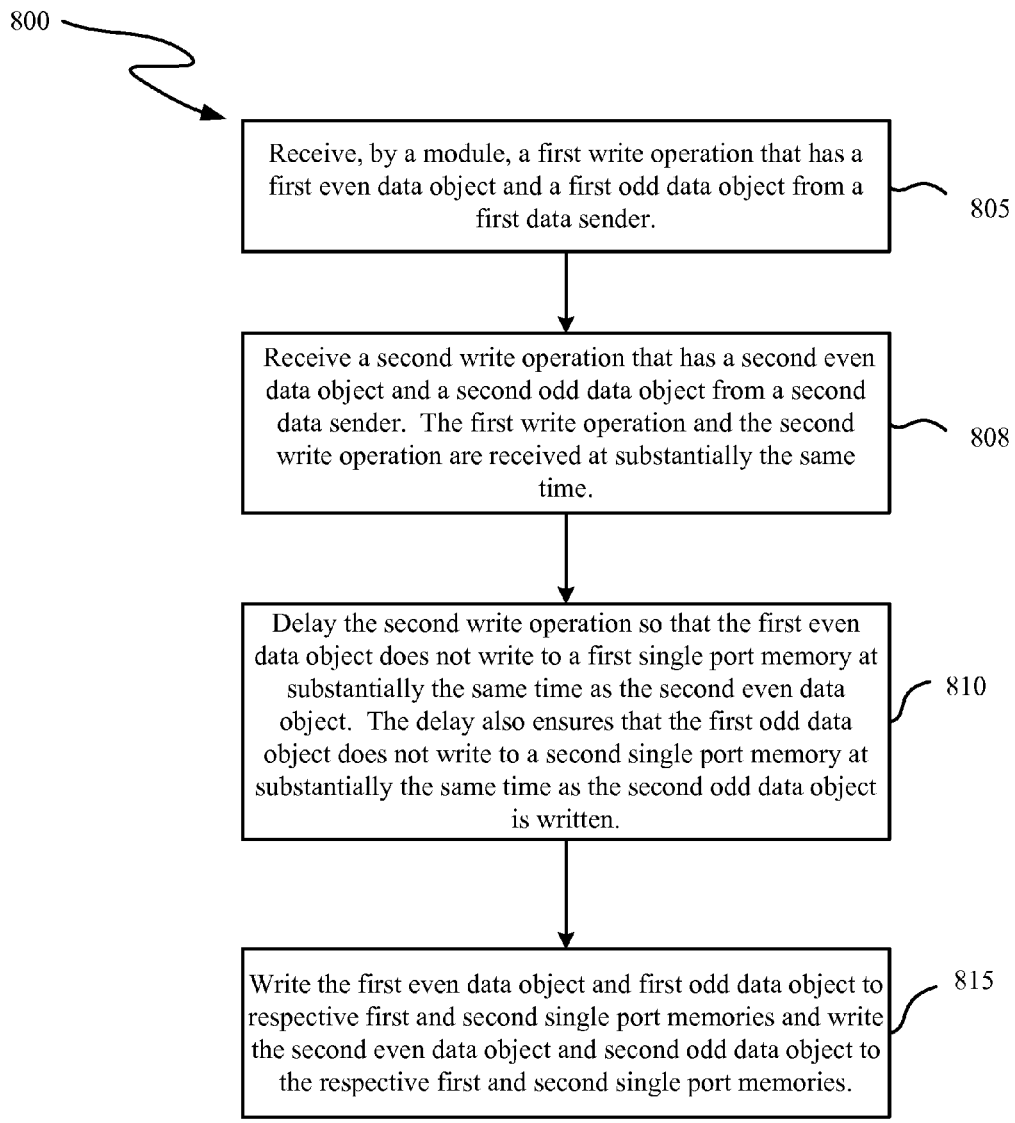
FIG. 8 illustrates a flowchart of a method for avoiding a write collision in a single port memory device in a module, such as a module of FIG. 5, according to embodiments.

FIG. 8 illustrates a flowchart for avoiding a write collision in a single port memory device in the module 500 of FIG. 5, according to embodiments. The method 800 may begin at operation 805. In operation 805, the module may receive a first write operation that has a first even data object and first odd data object from a first data sender.

In operation 808, the module may also receive a second write operation that has a second even data object and a second odd data object from a second data sender. The first write operation and the second write operation may be received by the module at substantially the same time and aligned the same.

In operation 810, the second write operation may be delayed so that the first even data object does not write to a first single port memory device at substantially the same time as the second even data object. The delay also ensures that the first odd data object does not write to a second single port memory device at substantially the same time as the second odd data object is written.

In operation 815, the first even data object may be written to the first single port memory device and the first odd data object may be written to the second single port memory device. Furthermore, the second even data object may be written to the first single port memory device and the second odd data object may be written to the second single port memory device.

While the invention has been described with reference to specific embodiments thereof, those skilled in the art will be able to make various modifications to the described embodiments without departing from the true spirit and scope of the embodiments. The terms and descriptions used herein are set forth by way of illustration only and are not meant as limitations. Those skilled in the art will recognize that these and other variations are possible within the spirit and scope of the embodiments as defined in the following claims and their equivalents.

What is claimed is:

1. A method of avoiding a write collision in single port memory devices from two or more independent write operations, comprising:
   receiving, by a module, a first write operation having a first even data object and a first odd data object from a first data sender,
   receiving, by the module, a second write operation having a second even data object and a second odd data object from a second data sender at substantially a same time as the first write operation;
   delaying the second write operation so that the first even data object writes to a first single port memory device at a different time than the second even data object writes to the first single port memory device, and delaying the second write operation so that the first odd data object writes to a second single port memory device at a different time than the second odd data object; and
   writing the first even data object and first odd data object to respective first and second single port memory devices and writing the second even data object and second odd data object to the respective first and second single port memory devices.

2. The method of claim 1, wherein the first data sender and second data sender are configured to align the first write operation and second write operation so that they are received by the module at substantially a same time.

3. The method of claim 1, wherein the first data sender and the second data sender are cache memories.

4. The method of claim 1, wherein the first odd data object is written to the first single port memory device at substantially a same time as the second even data object is written to the second single port memory device.

5. The method of claim 1, wherein the first single port memory device and the second single port memory device include an upper half single port memory device and a lower half single port memory device to store a highest order bits address of data objects in the upper half and a lowest order bit address of the data objects in the lower half.

6. The method of claim 1, wherein the single port memory devices are single port static random access memory (SRAM).

7. The method of claim 1, further comprising:
   receiving a read request for the first even data object from a first read requester;
   reading an upper half of the first even data object from an upper half of the first single port memory device;
   reading a lower half of the first even data object from a lower half of first single port memory device at substantially a same time as reading the upper half of the first even data object; and
   combining the upper half and lower half of the first even data object to obtain the first data object, which is sent to the read requester.

8. The method of claim 1, further comprising:
   receiving a first read request for the first even data object and the first odd data object from a first read requester;
   receiving a second read request for the second even data object and second odd data object from a second read requester at substantially a same time as receiving the first read request;
   reading the first even data object from the first single port memory device;
   reading the second odd data object from the second single port memory device at substantially a same time as reading the first even data object from the first single port memory device;
   reading the second even data object from the first single port memory device; and
   reading the first odd data object from the second single port memory device at substantially a same time as reading the second even data object from the first single port memory device.

9. A semiconductor chip, comprising:
   a module, comprising:
      a first single port memory device configured to store a first even data object and a second even data object,
      a second single port memory device configured to store a first odd data object and a second odd data object, and
      the module configured to:
         receive a first write operation having a first even data object and a first odd data object from a first data sender,
         receive a second write operation having a second even data object and a second odd data object from a second data sender at substantially a same time as the first write operation;
         delay the second write operation so that the first even data object writes to a first single port memory device at a different time than the second even data object writes to the first single port memory device, and delay the second write operation so that the first odd data object writes to a second single port memory device at a different time than the second odd data object; and
         write the first even data object and first odd data object to respective first and second single port memory devices and write the second even data object and second odd data object to the respective first and second single port memory devices.

10. The semiconductor chip of claim 9, wherein the first data sender and second data sender are configured to align the first write operation and second write operation so that they are received by the module at substantially a same time.

11. The semiconductor chip of claim 9, wherein the first data sender and the second data sender are cache memories.

12. The semiconductor chip of claim 9, wherein the module further comprises:
   a read controller configured to:
      receive a read request for the first even data object from a first read requester;
      read an upper half of the first even data object from an upper half of the first single port memory device;
      read a lower half of the first even data object from a lower half first single port memory device at substantially a same time as reading the upper half of the first even data object; and combine the upper half and lower half of the first even data object to obtain the first data object, which is sent to the read requester.

13. The semiconductor chip of claim 9, wherein the module further comprises:
a read controller configured to:
receive a first read request for the first even data object and the first odd data object from a first read requester;
receive a second read request for the second even data object and second odd data object from a second read requester at substantially a same time as receiving the first read request;
read the first even data object from the first single port memory device;
read the second odd data object from the second single port memory device at substantially a same time as reading the first even data object from the first single port memory device;
read the second even data object from the first single port memory device; and
read the first odd data object from the second single port memory device at substantially a same time as reading the second even data object from the first single port memory device.

14. The semiconductor chip of claim 9, wherein the first odd data object is written to the first single port memory device at substantially a same time as the second even data object is written to the second single port memory device.

15. The semiconductor chip of claim 9, wherein the first single port memory device and the second single port memory device include an upper half single port memory device and a lower half single port memory device to store a highest order bits address of data objects in the upper half and a lowest order bit address of the data objects in the lower half.

16. The semiconductor chip of claim 9, wherein the single port memory device is a single port static random access memory (SRAM).

17. A method of avoiding read collisions from single port memory devices from two or more independent read operation requests, comprising:
receiving a first read request for a first even data object and a first odd data object from a first read requester, the first even data object is stored in a first single port memory device and the first odd data object is stored in a second single port memory device;
receiving a second read request for a second even data object and a second odd data object from a second read requester at substantially a same time as receiving the first read request, the second even data object is stored in a first single port memory device and the second odd data object is stored in a second single port memory device;
reading the first even data object from the first single port memory device;
reading the second odd data object from the second single port memory device at substantially a same time as reading the first even data object from the first single port memory device;
reading the second even data object from the first single port memory device; and
reading the first odd data object from the second single port memory device at substantially a same time as reading the second even data object from the first single port memory device.

18. The method of claim 17, further comprising:
sending the first even data object to the first read requester and the second odd data object to the second read requester at substantially a same time.

19. The method of claim 17, further comprising:
writing two or more independent write operations to single port memory devices without write collisions by:
receiving, by a module, a first write operation having the first even data object and the first odd data object from a first data sender,
receiving, by the module, a second write operation having the second even data object and the second odd data object from a second data sender at substantially a same time as the first write operation;
delaying the second write operation so that the first even data object writes to a first single port memory device at a different time than the second even data object writes to the first single port memory device, and delaying the second write operation so that the first odd data object writes to a second single port memory device at a different time than the second odd data object; and
writing the first even data object and first odd data object to respective first and second single port memory devices and writing the second even data object and second odd data object to the respective first and second single port memory devices.

20. The method of claim 17, wherein the single port memory device is a single port static random access memory (SRAM).

* * * * *